United States Patent
Hyoudo et al.

(10) Patent No.: US 6,197,616 B1
(45) Date of Patent: *Mar. 6, 2001

(54) METHOD OF FABRICATING SEMICONDUCTOR DEVICE

(75) Inventors: Haruo Hyoudo; Takayuki Tani; Takao Shibuya, all of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/448,942

(22) Filed: Nov. 24, 1999

(30) Foreign Application Priority Data

Nov. 27, 1998 (JP) .................................................. 10-337837

(51) Int. Cl.$^7$ ........................... H01L 21/44; H01L 21/48; H01L 21/50
(52) U.S. Cl. ........................... 438/113; 438/106; 438/107; 438/110; 438/111; 438/112; 438/114; 438/125; 438/126; 438/127; 438/460
(58) Field of Search .................................... 438/106, 107, 438/110–114, 125–127, 460

(56) References Cited

U.S. PATENT DOCUMENTS 5,468,999 11/1995 Lin et al. .

5,744,758 4/1998 Takenouchi et al. .

FOREIGN PATENT DOCUMENTS

| 058068 | 8/1982 | (EP) . |
| 689245 | 12/1995 | (EP) . |
| 09036151 | 2/1997 | (JP) . |

*Primary Examiner*—John F. Niebling
*Assistant Examiner*—David A. Zarneke
(74) *Attorney, Agent, or Firm*—Wenderoth, Lind & Ponack, L.L.P.

(57) ABSTRACT

An object of the present invention is to provide a method of fabricating a semiconductor device having a relatively small package structure and hence a relatively small mounting area.

An insulating board with a plurality of device carrier areas thereon is prepared, and semiconductor chips are mounted on the respective device carrier areas and then covered with a common resin layer. The resin layer and said insulating board are separated along dicing lines into segments including the device carrier areas thereby to produce individual semiconductor devices. External electrodes connected to electrodes of the semiconductor chips are mounted on the back of the insulating board. The external electrodes are positioned symmetrically with respect to central lines of the packaged semiconductor device for preventing various problems which would otherwise be caused when such a small package is mounted.

6 Claims, 9 Drawing Sheets

FIG. 12B

METHOD OF FABRICATING SEMICONDUCTOR DEVICE

BACKGROUND OF THE INVENTION

1. Field of the Invention

The present invention relates to a method of fabricating a semiconductor device, and more particularly to a method of fabricating a semiconductor device having a reduced package contour, a reduced mounting area, and a reduced cost.

2. Description of the Related Art

In the fabrication of semiconductor devices, it has been customary to separate semiconductor chips from a wafer by dicing, fixing the semiconductor chips to a lead frame, sealing the semiconductor chips fixed to the lead frame with a mold and a synthetic resin according to a transfer molding process, and dividing the sealed semiconductor chips into individual semiconductor devices. The lead frame comprises a rectangular or hooped frame. A plurality of semiconductor devices are simultaneously sealed in one sealing process.

Figure 1:
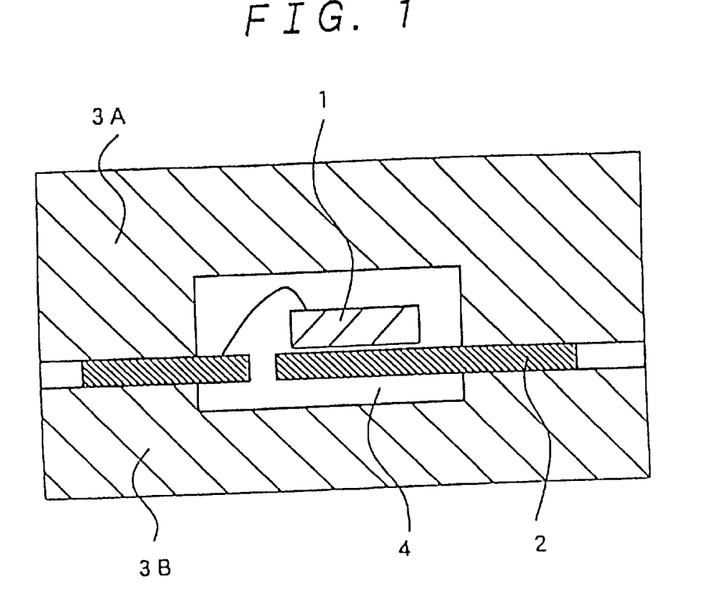
FIG. 1 is a cross-sectional view illustrative of a conventional transfer molding process.

FIG. 1 of the accompanying drawings illustrates a conventional transfer molding process. In the conventional transfer molding process, a lead frame 2 to which semiconductor chips 1 are fixed by die bonding and wire bonding is placed in a cavity 4 defined by upper and lower molds 3A, 3B. Epoxy resin is then poured into the cavity 4 to seal the semiconductor chips 1. After the transfer molding process, the lead frame 2 is cut off into segments containing the respective semiconductor chips 1, thus producing individual semiconductor devices. For more details, reference should be made to Japanese laid-open patent publication No. 05-129473, for example.

Figure 2:
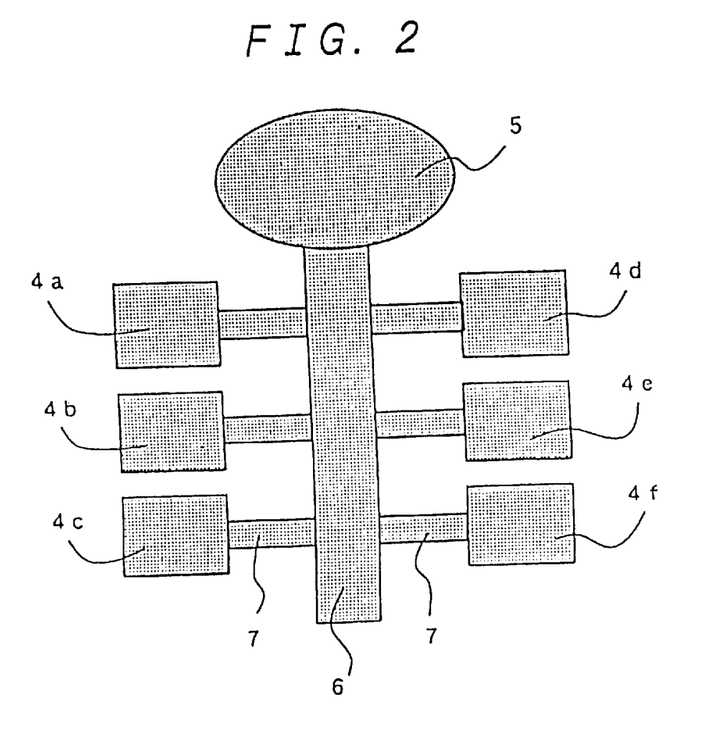
FIG. 2 is a plan view illustrative of the conventional transfer molding process.

Actually, as shown in FIG. 2 of the accompanying drawings, the lower mold 3B has a number of cavities 4a–4f, a source 5 of synthetic resin, a runner 6 connected to the source 5 of synthetic resin, and gates 7 for pouring the synthetic resin from the runner 6 into the cavities 4a–4f. The cavities 4a–4f, the source 5 of synthetic resin, the runner 6, and the gates 7 are all in the form of recesses and grooves defined in the surface of the lower mold 3B. If the lead frame 2 is of a rectangular shape, then ten semiconductor chips 1 are mounted on one lead frame, and the lower mold 3B has ten cavities 4, ten gates 7, and one runner 6 per lead frame. The entire lower mold 3B has as many as cavities 4 as necessary for twenty lead frames 2, for example.

Figure 3:
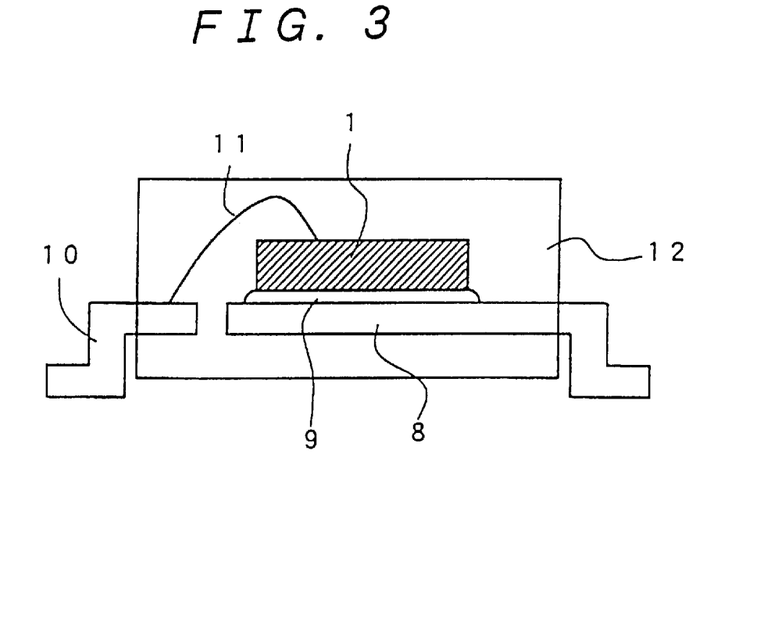
FIG. 3 is a cross-sectional view of a semiconductor device fabricated by the conventional transfer molding process.

FIG. 3 of the accompanying drawings shows a semiconductor device fabricated by the conventional transfer molding process. As shown in FIG. 3, a semiconductor chip 1 containing components such as transistors is fixedly mounted on an island 8 of a lead frame by a bonding material 9 such as solder. The semiconductor chip 1 has electrode pads connected to leads 10 by wires 11, and has its peripheral portions covered with a molded body 12 of synthetic resin which is complementary in shape to the cavity 4. The leads 10 have respective distal ends projecting out of the molded body 12 of synthetic resin.

In the conventional semiconductor package shown in FIG. 3, since the leads 10 for connection to external circuits projects from the molded body 12 of synthetic resin, dimensions of the package that extend up to the projecting distal ends of the leads 10 need to be considered as covering a mounting area of the package. Therefore, the mounting area of the package is much larger than the contour of the molded body 12 of synthetic resin.

Furthermore, according to the conventional transfer molding process, since the molded body 12 of synthetic resin is hardened while it is being placed under pressure, the synthetic resin is also hardened in the runner 6 and the gates 7, and the hardened synthetic resin in the runner 6 and the gates 7 has to be thrown away. Because the gates 7 are required for respective individual semiconductor devices to be fabricated, the synthetic resin is not utilized highly efficiently, but the number of semiconductor devices that can be fabricated is small relatively to the amount of synthetic resin used.

SUMMARY OF THE INVENTION

It is therefore an object of the present invention to provide a method of fabricating a semiconductor device having a relatively small package structure and hence a relatively small mounting area.

Another object of the present invention is to provide a method of fabricating a semiconductor device relatively inexpensively.

According to the present invention, there is provided a method of fabricating a semiconductor device, comprising the steps of preparing an insulating board with a plurality of device carrier areas thereon, the insulating board having an electrode pattern serving as external electrodes of the semiconductor chips on a back of the insulating board, fixing semiconductor chips respectively to the device carrier areas, covering the semiconductor chips with a resin layer, and separating the resin layer and the insulating board into segments including the device carrier areas thereby to produce individual semiconductor devices, the external electrodes being positioned symmetrically with respect to a central line of the insulating board.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A method of fabricating a semiconductor device according to the present invention will be described below in terms of successive steps thereof with reference to FIGS. 4 through 12A and 12B.

1st Step

Figure 4:
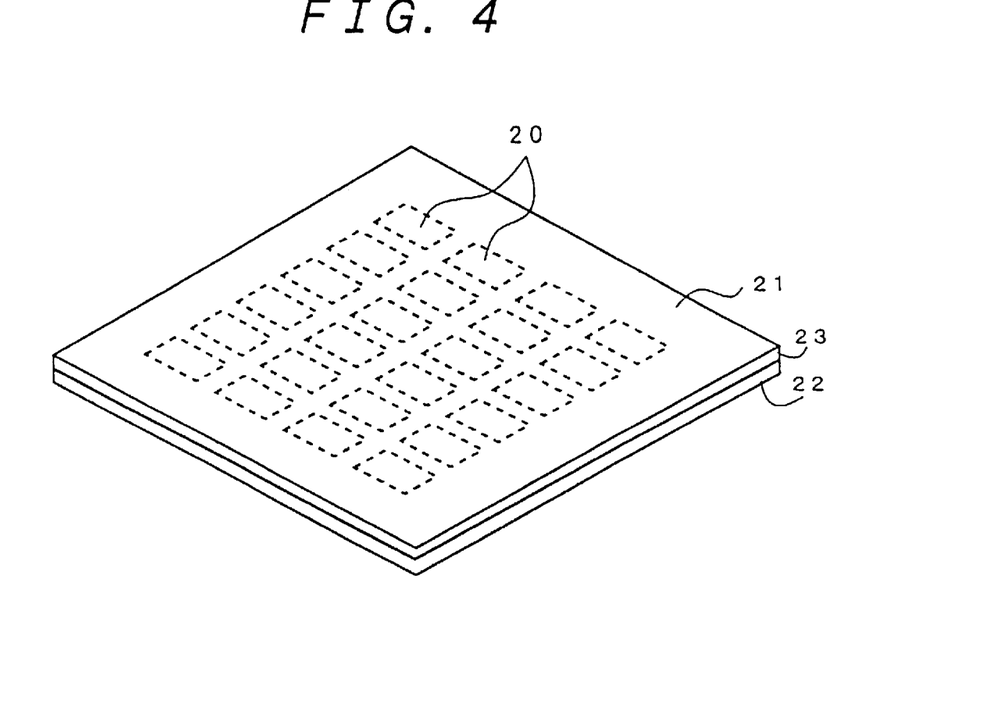
FIG. 4 is a perspective view illustrative of a method of fabricating a semiconductor device according to the present invention.

First, as shown in FIG. 4, a large-size common board 21 having a two-dimensional matrix of 100 device carrier areas 20 each corresponding to a semiconductor device. The common board 21 comprises one or more insulating boards of ceramics, glass epoxy, or the like, and has a total thickness ranging from 250 to 350 µm to provide a mechanical strength large enough to withstand stresses imposed during the fabrication process. In the illustrated embodiment, the common board 21 comprises a first insulating board 22 having a thickness of about 100 µm and a second insulating board 23 having a thickness of about 200 µm. The first and second insulating boards 22, 23 are superposed one on the other.

An electrically conductive pattern made of printed metal paste of tungsten or the like and electroplated gold is formed on the surface of each of the device carrier areas 20. Specifically, the first and second insulating boards 22, 23 each with printed metal paste of tungsten or the like are bonded to each other and then baked, after which a plated layer of gold is formed on the printed metal paste by an electroplating process.

Figure 5A:
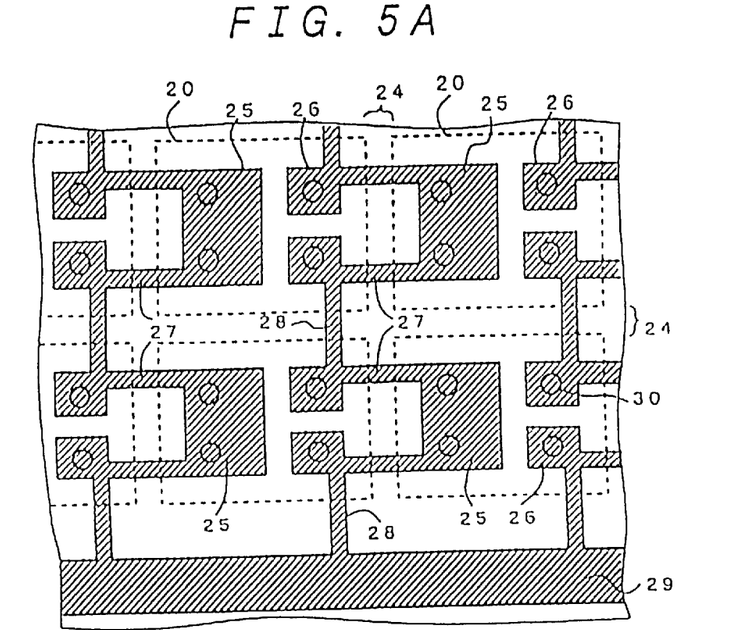
FIGS. 5A and 5B are fragmentary plan views illustrative of the method of fabricating a semiconductor device according to the present invention.
Figure 5B:
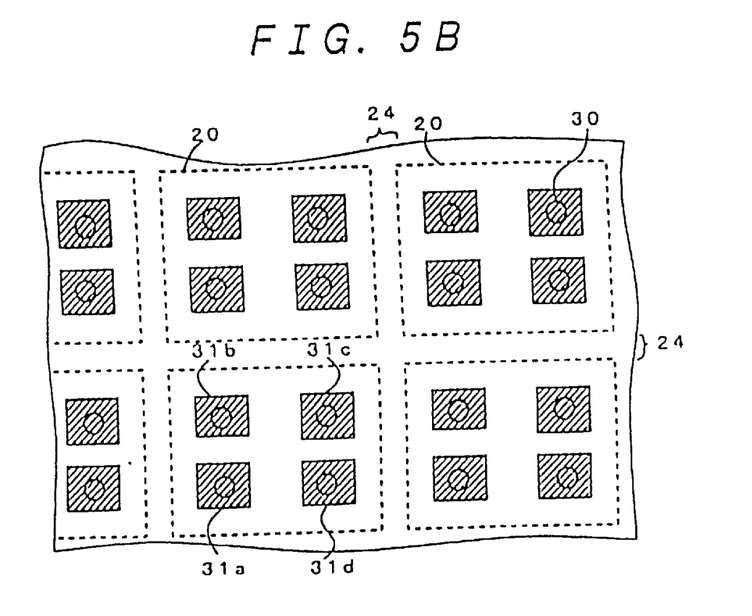

FIG. 5A shows in plan an electrically conductive pattern formed on the face of the first insulating board 22, and FIG. 5B shows in plan an electrically conductive pattern formed on the back of the first insulating board 22.

Each of the device carrier areas 20, enclosed by the dotted lines, has a rectangular shape having a longer side which is 1.0 mm long and a shorter side which is 0.8 mm long, for example. The device carrier areas 20 are arranged in a two-dimensional matrix, and adjacent ones of the device carrier areas 20 are spaced from each other by a distance ranging from 20 to 50 µm. The spacing between adjacent ones of the device carrier areas 20 serves as a dicing line 24 in a subsequent step. In each of the carrier areas 20, the electrically conductive pattern provides an island 25 and leads 26. The electrically conductive pattern segments in the device carrier areas 20 are identical in shape to each other.

The island 25 is a region where a semiconductor chip is to be mounted, and the leads 26 are to be connected by wires to electrode pads of a semiconductor chip on the island 25. Two first joint arms 27, each having a width of 0.5 mm, for example, much smaller than the width of the island 25, extend continuously from the island 25 across the dicing line 24 to the leads 26 of an adjacent device carrier area 20. Two second joint arms 28 extend continuously from the island 25 in directions perpendicular to the first joint arms 27 across the dicing lines 24 to the leads 26 of adjacent device carrier areas 20. Some of the second joint arms 28 are connected to a common joint 29 extending around the device carrier areas 20. The first and second joint arms 27, 28 which are thus extended and connected electrically connect the islands 25 and the leads 26 to each other.

As shown in FIG. 5B, the first insulating board 22 has through holes 30 defined in each of the device carrier areas 20. An electrically conductive material such as tungsten is filled in the through holes 30. External electrodes 31a, 31b, 31c, 31d are formed on the back of the first insulating board 22 in alignment with the respective through holes 30.

The external electrodes 31a, 31b, 31c, 31d are spaced or retracted a distance ranging from 0.05 to 0.1 mm inwardly from the edges of each of the device carrier areas 20, and electrically connected to the common joint 29 via the through holes 30.

Figure 6A:
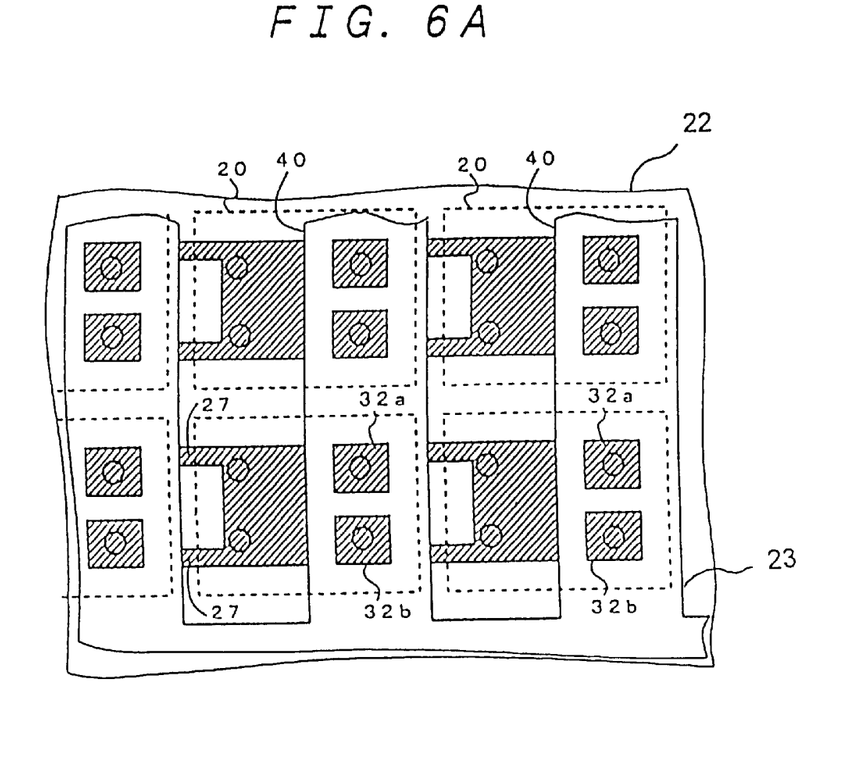
FIGS. 6A and 6B, are plan and cross-sectional views, respectively, illustrative of the method of fabricating a semiconductor device according to the present invention.
Figure 6B:
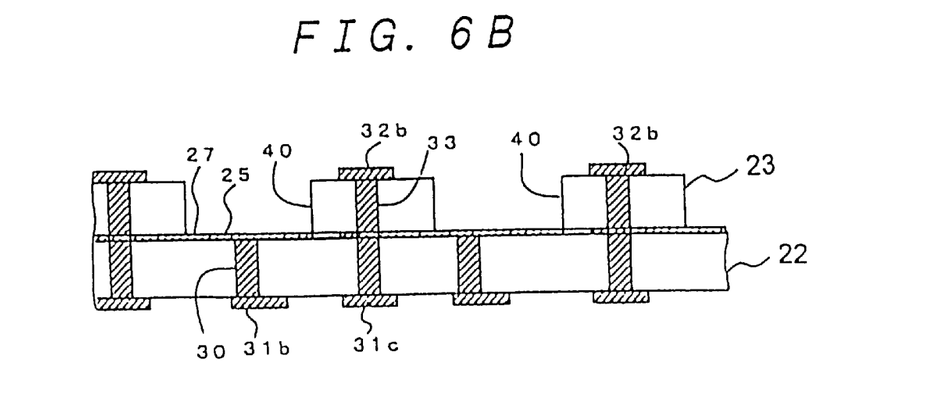

FIG. 6A shows in plan the second insulating board 23 bonded to the first insulating board 22, and FIG. 6B shows in cross section the second insulating board 23 bonded to the first insulating board 22.

The second insulating board 23 has openings 40 extending over the islands 25 and leads 32a, 32b vertically aligned with the leads 26. The second insulating board 23 has through holes 33 defined therein in alignment with the leads 32a, 32b and electrically connected to the respective leads 26 on the first insulating board 22. Therefore, the leads 32a, 32b are electrically connected to the external electrodes 31c, 31d.

The leads 32a, 32b are spaced or retracted a distance ranging from about 0.05 to 0.1 mm inwardly from the edges of each of the device carrier areas 20. Only the first and second joint arms 27, 28 of the narrow width extend across the dicing lines 24.

With the first and second insulating boards 22, 23 bonded to each other, a plated layer of gold of the electrically conductive pattern is formed by the electroplating process which employs the electrically conductive pattern as one electrode. Since the electrically conductive pattern segments in the device carrier areas 20 are electrically connected to each other by the common joint 29, it is possible to employ the electroplating process. However, no plated layer is formed on the mating surfaces of the first and second insulating boards 22, 23.

Figure 7A:
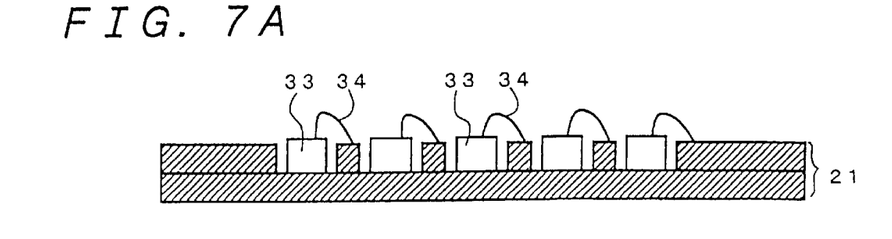
FIGS. 7A through 7D are cross-sectional views illustrative of the method of fabricating a semiconductor device according to the present invention.

2nd Step: (FIG. 7A)

Semiconductor chips 33 are mounted on the respective device carrier areas 20 of the common board 21 with the plated layer of gold, by die bonding and wire bonding. Specifically, the semiconductor chips 33 are fixed to the surfaces of the islands 25 by an adhesive such as an Ag paste, and the electrode pads of the semiconductor chips 33 are connected to the leads 32a, 32b by wires 34. The semiconductor chips 33 comprise three-terminal active components such as bipolar transistors, power MOSFETs, or the like. If the semiconductor chips 33 comprise bipolar transistors, then the external electrodes 31a, 31b serve as collector terminals, and the external electrodes 31c, 31d connected to the leads 32a, 32b serve as base and emitter electrodes, respectively.

Figure 7B:
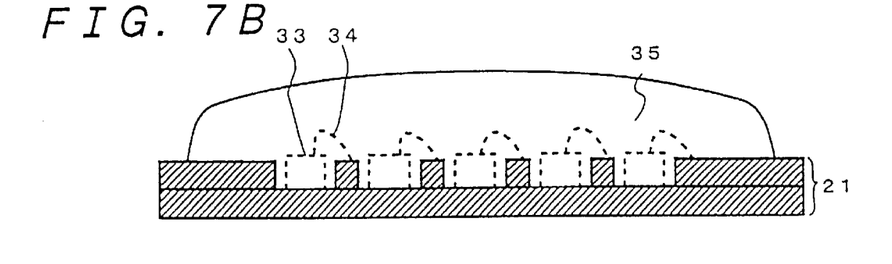

3rd Step: (FIG. 7B)

A predetermined amount of liquid epoxy resin is dropped from a dispenser delivered to a position over the common board 21 by potting to cover all the semiconductor chips 33 with a common resin layer 35. For example, if 100 semiconductor chips 33 are mounted on one common board 21, then all of the 100 semiconductor chips 33 are covered with the common resin layer 35. The liquid epoxy resin may be CV576AN (manufactured by Matsushita Electric Works, Ltd.). Since the dropped liquid epoxy resin is relatively highly viscous and has a surface tension, the common resin layer 35 has a round surface.

Figure 7C:
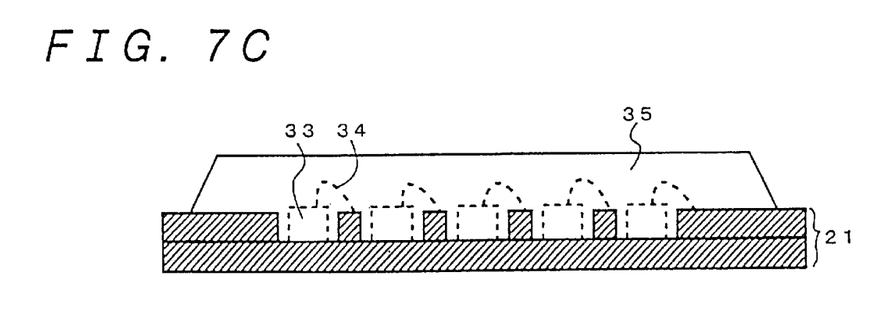

4th Step: (FIG. 7C)

The round surface of the common resin layer 35 is processed into a flat surface. For example, a flat member may be pressed against the round surface of the common resin layer 35 to flatten the surface before the dropped liquid resin is hardened, or after the dropped liquid resin is cured at a temperature ranging from 100 to 200 degrees for several hours, the round surface of the common resin layer 35 may be cut to a flat surface by a dicing device with a dicing blade. Specifically, the round surface of the common resin layer 35 may be cut off by the dicing blade to achieve a constant height from the common board 21. In this step, the thickness of the common resin layer 35 is set to 0.3–1.0 mm. The flat surface extends to the edges of the common resin layer 35 such that when outermost semiconductor chips 33 are separated into individual semiconductor devices, they have resin layer contours which meet a standardized package size requirement. Of various available dicing blades having different thicknesses, a relatively thick dicing blade is used to cut the round surface of the common resin layer 35 repeatedly a plurality of times to develop a flat surface.

Figure 7D:
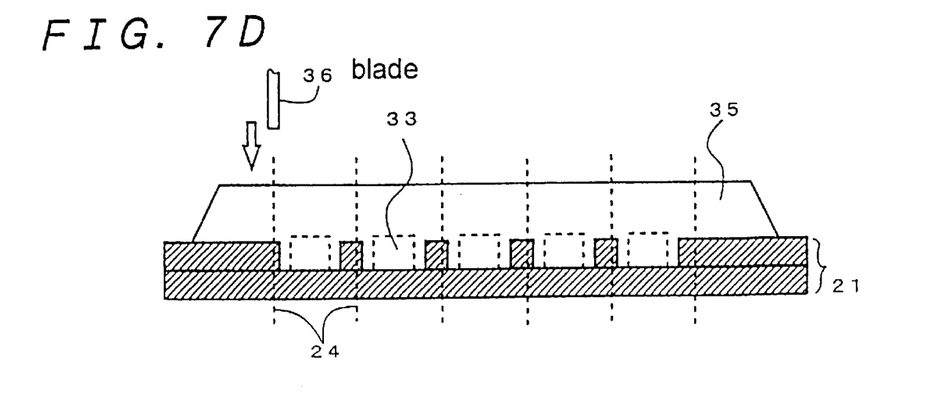

5th Step: (FIG. 7D)

The common resin layer 35 is severed into segments containing the respective device carrier areas 20 to separate individual semiconductor devices by a dicing device. Specifically, a dicing blade 36 is used to cut off the common resin layer 35 and the common board 21 simultaneously along the dicing lines 24 to produce separate semiconductor devices on the respective device carrier areas 20. In the dicing process, a blue sheet (e.g., trade name: UV SHEET manufactured by Lintec Corp.) is applied to the back of the common board 21, and the dicing blade 36 is thrust to such a depth as to reach the surface of the blue sheet thereby to cut off the common resin layer 35 and the common board 21. At this time, the dicing device automatically recognizes alignment marks on the surface of the common board 21 and uses the alignment marks as a positional reference in the dicing process.

Figure 8A:
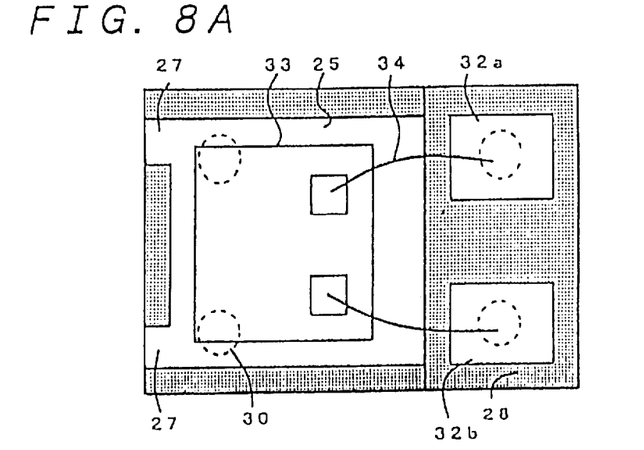
FIGS. 8A and 8B are plan and cross-sectional views illustrative of the method of fabricating a semiconductor device according to the present invention.
Figure 8B:
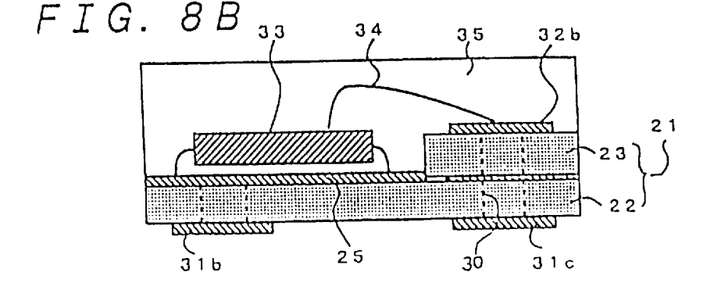

FIGS. 8A and 8B show a semiconductor device 33 fabricated by the above successive steps.

Each package of the semiconductor device 33 has four sides defined by cut edges of the resin layer 35 and the common board 21, an upper surface defined by the flat surface of the resin layer 35, and a lower surface defined by the back of the first insulating board 22.

The second insulating board 23 gives a height difference between the leads 32a, 32b and the island 25. The height difference improves the bondability of the semiconductor chip 33 upon wire bonding. The wall thickness of the second insulating board 23 serves to maintain a desired mechanical strength of the assembly during the fabrication process. Since, however, the package size would be increased if the second insulating board 23 extended fully around the semiconductor chip 33, the second insulating board 23 is positioned so as to extend along one side of the package. The island 25 is accordingly positioned on one side of the package, rather than at the center of the package, with the leads 32a, 32b on the opposite side of the package.

The semiconductor device has a size including a length of 1.0 mm, a width of 0.6 mm, and a height of 0.5 mm. The first insulating board 22 is covered with the common resin layer 35, sealing the semiconductor chip 33. The semiconductor chip 33 has a thickness of about 150 $\mu$m. The bonding wires 34 are curved upwardly to a height of about 150 $\mu$m from the surface of the semiconductor chip 33. The island 25 and the leads 32a, 32b are spaced or retracted from the edges of the package, with cut edges of the first and second joint arms 27, 28 being exposed on edges of the package.

Figure 9:
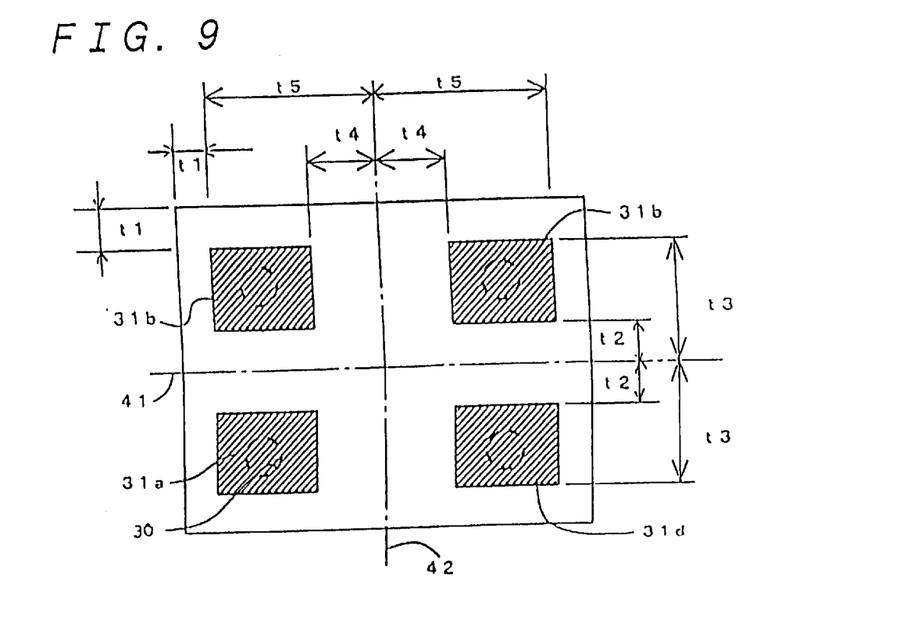
FIG. 9 is a plan view illustrative of the method of fabricating a semiconductor device according to the present invention.

FIG. 9 shows a detailed pattern of the external electrodes 31a–31d. The external electrodes 31a–31d are disposed at the respective four corners of the back of the first insulating board 22, and each have a size of 0.2 ×0.3 mm. The external electrodes 31a–31d are vertically (as viewed in FIG. 9) symmetrical with respect to a horizontal central line 41, and horizontally (as viewed in FIG. 9) symmetrical with respect to a vertical central line 42 which extends perpendicularly to the horizontal central line 41. The external electrodes 31a–31d have inner horizontal side edges spaced from the horizontal central line 41 by equal distances t2 and outer horizontal side edges spaced from the horizontal central line 41 by equal distances t3. The external electrodes 31a–31d have inner vertical side edges spaced from the vertical central line 42 by equal distances t4 and outer vertical side edges spaced from the vertical central line 42 by equal distances t5. Since the symmetrical layout of the external electrodes 31a–31d makes it difficult to distinguish their polarities from each other, it is preferable to form recesses in or apply printed indicia to the surfaces of the external electrodes 31a–31d to provide marks indicating their polarities.

The outer horizontal and vertical side edges of the external electrodes 31a–31d are spaced or retracted from the side edges of the package by equal distances t1 of about 0.05 mm. It would often pose problems if the plated layer of gold were cut off by the dicing blade. However, since the external electrodes 31a–31d are spaced from the dicing lines and electrically connected by a minimum line width of electrode, any plated layer of gold that is brought into contact with the dicing blade is held to a minimum for decreasing the above mentioned problems.

Because semiconductor devices thus fabricated are packaged together by the potted resin layer, the amount of synthetic resin which would be wasted and the cost of the synthetic resin used are smaller than if the semiconductor devices were individually packaged. As no lead frames are used, the outer profile of the package is much smaller than if the package were fabricated according to the conventional transfer molding process. Since the terminals for external connection are mounted on the back of the board 21 and do not project from the package, the package has a reduced mounting area.

Figure 10A:
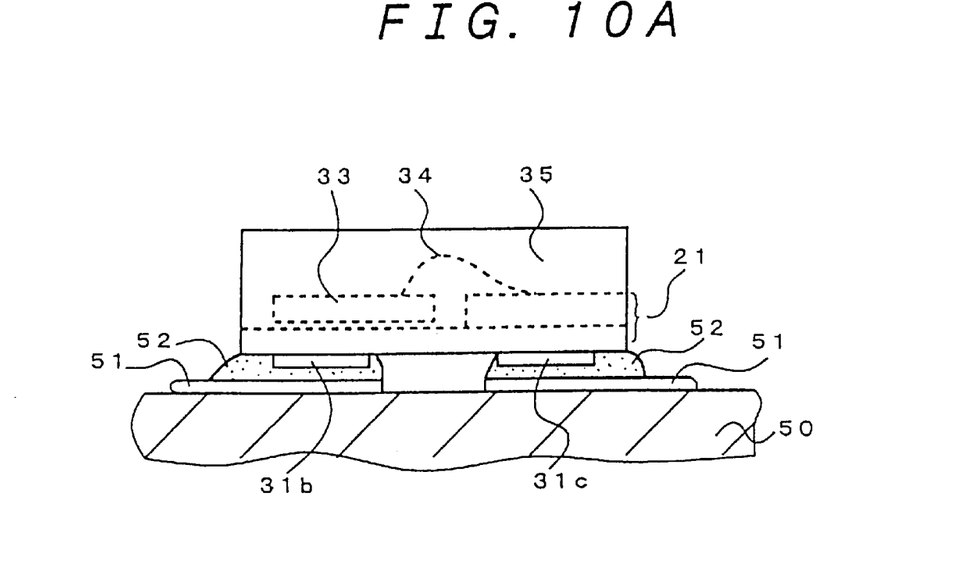
FIGS. 10A and 10B are plan and cross-sectional views illustrative of the method of fabricating a semiconductor device according to the present invention.
Figure 10B:
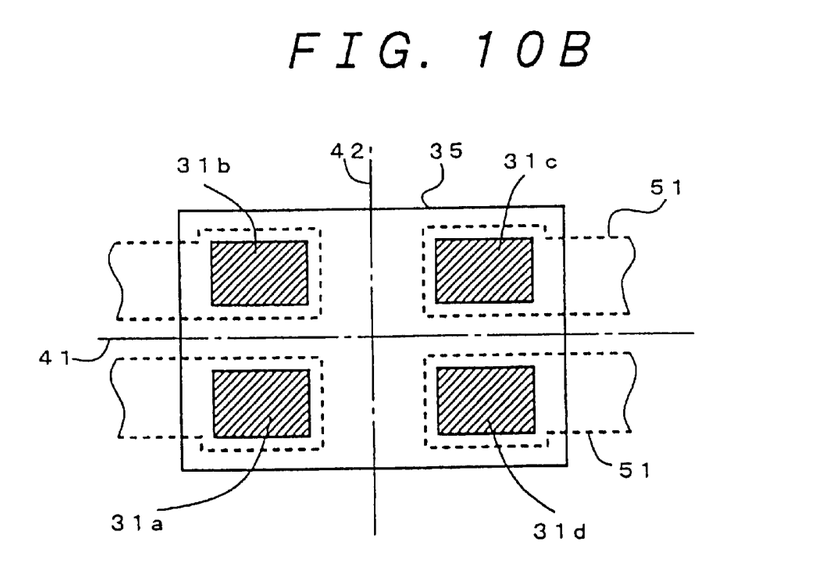
Figure 11A:
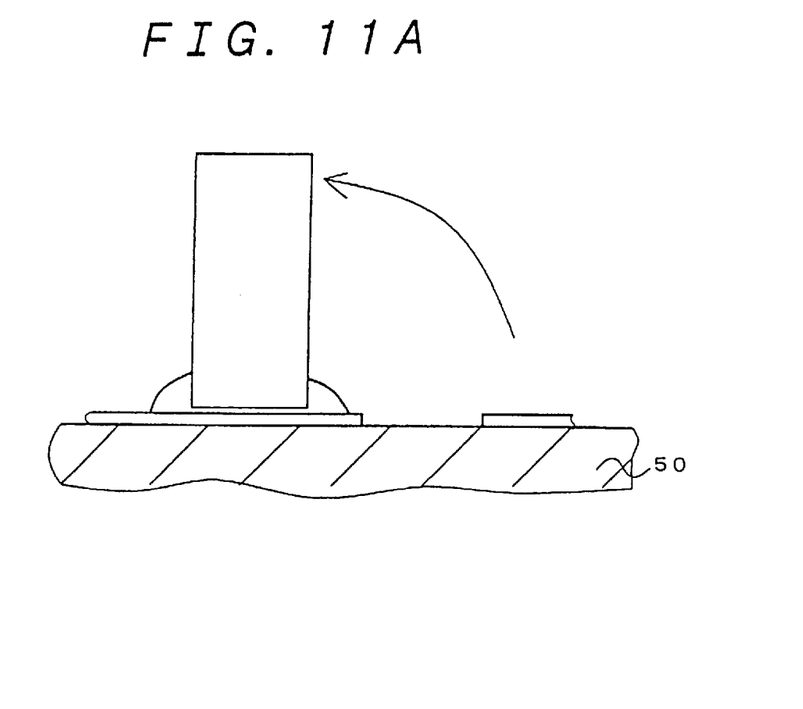
FIGS. 11A and 11B are plan views of semiconductor devices fabricated by method according to the present invention.
Figure 11B:
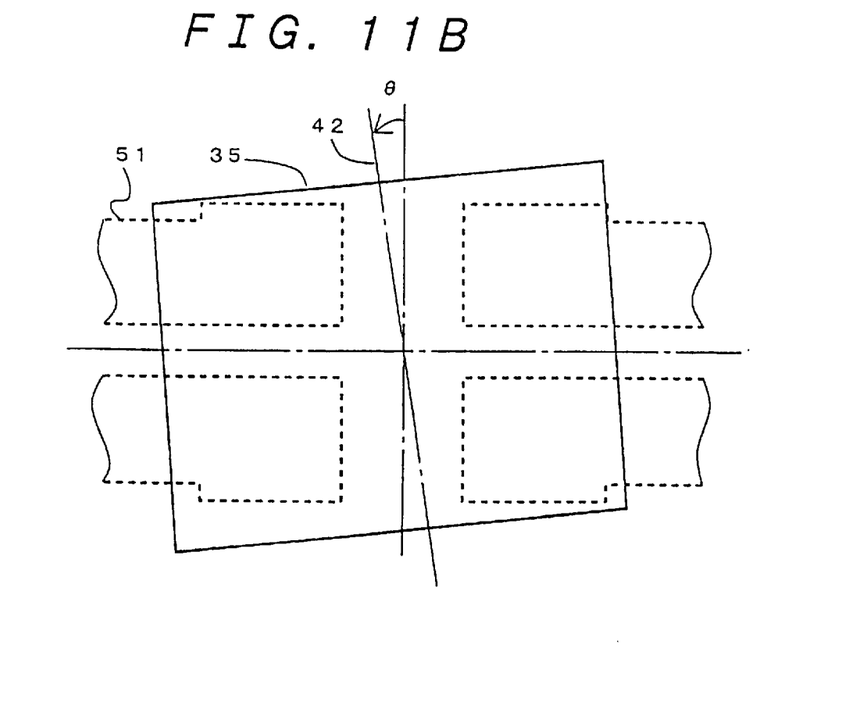

FIGS. 10A and 10B show a semiconductor device fabricated according to the present invention as it is mounted on a printed circuit board 50. The printed circuit board 50 has printed interconnections 51 to be connected to the external electrodes 31a–31d, the printed interconnections 51 having a pattern having shapes and dimensions matching those of the external electrodes 31a–31d. The printed interconnections 51 and the external electrodes 31a–31d are disposed in confronting relation to each other, and bonded to each other by solder layers 52. When the printed interconnections 51 and the external electrodes 31a–31d are bonded to each other, because the semiconductor device is extremely small in size and weight, the package would tend to be displaced out of position due to the surface tension of the molten solder. For example, the package might be erected as shown in FIG. 11A (a phenomenon called "Manhattan effect"), or angularly displaced by an angle $\theta$ as shown in FIG. 11B. The Manhattan effect is liable to occur when the molten solder flows around and wraps sides of the package, and the angular displacement of the package tends to happen if the external electrodes 31a–31d were positioned asymmetrically. According to the present invention, since the external electrodes 31a–31d are positioned on the back of the first insulating board 22 and not exposed on the sides of the package, they are less subject to the Manhattan effect. Furthermore, since the external electrodes 31a–31d are of the symmetrical layout, they are prevented from being angularly displaced as the surface tension of the molten solder is uniformly applied outwardly from the center of the package, i.e., the point of intersection of the central lines 41, 42.

Figure 12A:
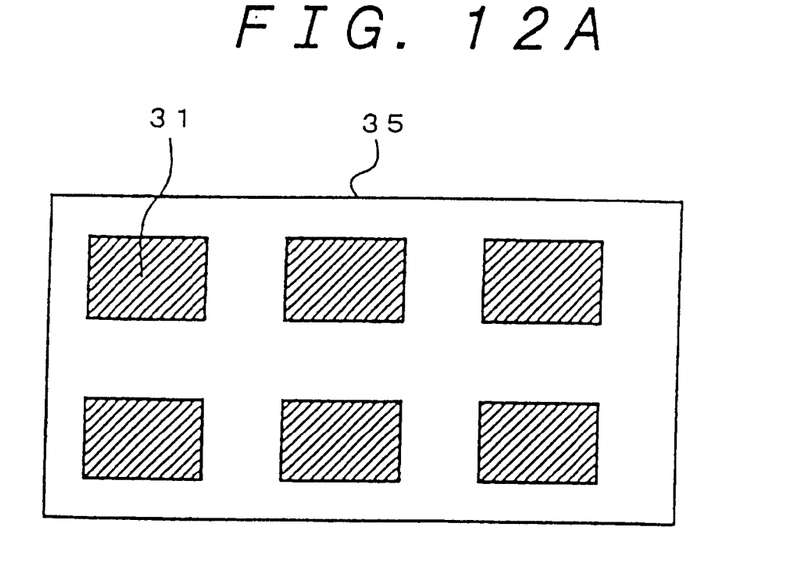
FIGS. 12A and 12B are plan views of semiconductor devices, which have six terminals and eight terminals, respectively.
Figure 12B:
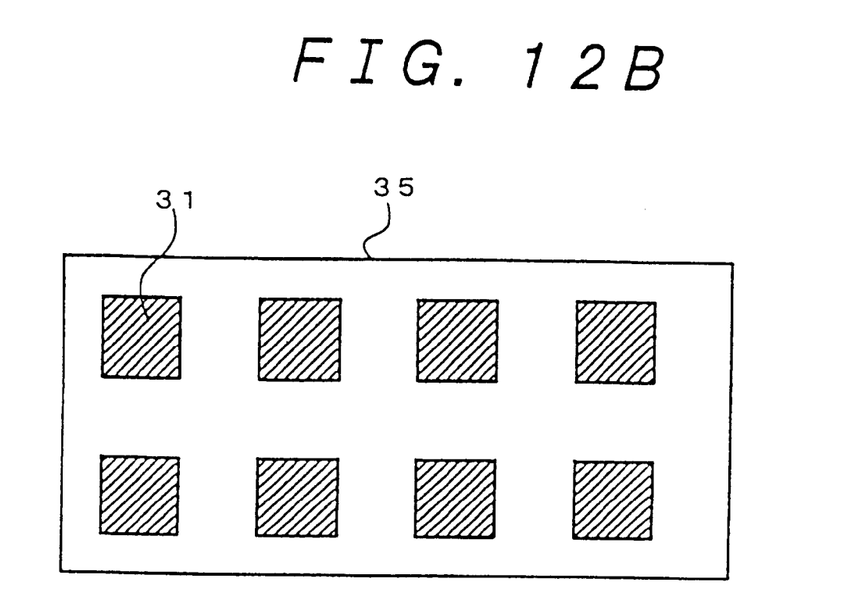

In the above embodiment, the three-terminal semiconductor device is sealed by the resin layer and has the four external electrodes. However, a semiconductor device may have six external terminals 31 as shown in FIG. 12A, or eight external terminals 31 as shown in FIG. 12B.

The method according to the present invention can produce a package structure which is smaller than semiconductor devices using a lead frame. Since no lead terminals project from the package, the package has a reduced mounting area and can be mounted at a high density.

The cost of the fabrication process is highly reduced because any molds with cavities are required for sealing semiconductor chips.

Inasmuch as the external electrodes 31*a*–31*d* are positioned symmetrically, various problems which would otherwise be caused when such a small package is mounted can be solved.

Although certain preferred embodiments of the present invention have been shown and described in detail, it should be understood that various changes and modifications may be made therein without departing from the scope of the appended claims.

What is claimed is:

1. A method of fabricating a semiconductor device, comprising the steps of:

preparing an insulating board with a plurality of device carrier areas thereon, said insulating board having an electrode pattern serving as external electrodes of the semiconductor chips on a back of said insulating board;

fixing semiconductor chips respectively to said device carrier areas;

covering the semiconductor chips with a resin layer; and     separating said resin layer and said insulating board into segments including the device carrier areas thereby to produce individual semiconductor devices;

wherein said external electrodes are positioned symmetrically with respect to a central line of said insulating board.

2. A method according to claim 1, wherein said external electrodes are connected to electrically conductive patterns formed in said device carrier area via through holes formed in said insulating board.

3. A method according to claim 1, wherein said external electrodes have edges spaced from edges of said insulating board.

4. A method according to claim 1, wherein each of said semiconductor chips comprises a three-terminal semiconductor chip and has four external electrodes.

5. A method according to claim 1, wherein said external electroads are rectangular shaped respectively.

6. A method according to claim 1, wherein said resin layer has marks on a surface thereof for indicating polarities of said external electrodes.

\* \* \* \* \*